United States Patent
Park et al.

(10) Patent No.: US 10,453,908 B2
(45) Date of Patent: Oct. 22, 2019

(54) ORGANIC LIGHT EMITTING DIODE DISPLAY COMPRISING INTERLAYER INSULATING LAYERS

(71) Applicant: SAMSUNG DISPLAY CO., LTD., Yongin, Gyeonggi-do (KR)

(72) Inventors: Young Woo Park, Seongnam-si (KR); Wang Woo Lee, Osan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 177 days.

(21) Appl. No.: 14/794,167

(22) Filed: Jul. 8, 2015

(65) Prior Publication Data

US 2016/0148985 A1    May 26, 2016

(30) Foreign Application Priority Data

Nov. 24, 2014  (KR) .................. 10-2014-0164742

(51) Int. Cl.
  *H01L 27/32* (2006.01)
  *H01L 27/12* (2006.01)
  *G09G 3/3233* (2016.01)

(52) U.S. Cl.
  CPC ........ *H01L 27/3262* (2013.01); *H01L 27/124* (2013.01); *H01L 27/1222* (2013.01); *H01L 27/3248* (2013.01); *H01L 27/3258* (2013.01); *H01L 27/3276* (2013.01); *G09G 3/3233* (2013.01); *G09G 2300/043* (2013.01);
  (Continued)

(58) Field of Classification Search
  CPC ............. H01L 27/3258; H01L 27/3262; H01L 27/3276; G09G 3/3233; G09G 2300/0246; G09G 2310/0262; G09G 2300/0426
  See application file for complete search history.

(56) References Cited

U.S. PATENT DOCUMENTS

2003/0080436 A1*  5/2003  Ishikawa ........... G02F 1/136227
                                                  257/776
2003/0141811 A1*  7/2003  Park .................... H01L 27/3265
                                                  313/506

(Continued)

FOREIGN PATENT DOCUMENTS

KR       10-0708863 B1    4/2007
KR       10-0728129 B1    6/2007

(Continued)

OTHER PUBLICATIONS

English machine translation of KR100708863B1 of record.*

(Continued)

*Primary Examiner* — Mohsen Ahmadi
*Assistant Examiner* — Christopher M Roland
(74) *Attorney, Agent, or Firm* — Kile Park Reed & Houtteman PLLC (57) ABSTRACT

Disclosed herein is an organic light emitting diode display, including a substrate, a first thin film transistor including a first active pattern on the substrate and a first gate electrode on the first active pattern, a data wire on the first gate electrode, a first interlayer insulating layer between the first gate electrode and the data wire, a second interlayer insulating layer positioned the first interlayer insulating layer and the data wire, and an organic light emitting diode positioned on the data wire and connected to the first active pattern.

19 Claims, 4 Drawing Sheets

(52) U.S. Cl.
CPC ............... *G09G 2300/0426* (2013.01); *G09G 2300/0861* (2013.01); *G09G 2310/0262* (2013.01); *H01L 27/1225* (2013.01); *H01L 27/3265* (2013.01)

(56) References Cited

U.S. PATENT DOCUMENTS

| | | | | |
|---|---|---|---|---|
| 2004/0075094 | A1* | 4/2004 | Yamazaki | H01L 27/1244 257/72 |
| 2005/0082968 | A1* | 4/2005 | Choi | G09G 3/3225 313/506 |
| 2006/0170067 | A1* | 8/2006 | Maekawa | H01L 29/41733 257/401 |
| 2011/0122100 | A1* | 5/2011 | Lee | H01L 51/5246 345/204 |
| 2011/0278571 | A1* | 11/2011 | Yamazaki | H01L 27/11521 257/57 |
| 2013/0257839 | A1* | 10/2013 | Hyeon | G06F 3/038 345/212 |
| 2014/0034923 | A1* | 2/2014 | Kim | H01L 27/3297 257/40 |
| 2014/0070184 | A1* | 3/2014 | Shin | H05B 33/0803 257/40 |
| 2014/0124754 | A1* | 5/2014 | Park | G09G 3/32 257/40 |
| 2014/0239270 | A1* | 8/2014 | Ko | H01L 27/1255 257/40 |
| 2014/0332771 | A1* | 11/2014 | Byun | H01L 27/3262 257/40 |
| 2015/0144892 | A1* | 5/2015 | Chang | H01L 27/3265 257/40 |
| 2016/0204182 | A1* | 7/2016 | Son | H01L 27/3276 257/40 |

FOREIGN PATENT DOCUMENTS

| | | |
|---|---|---|
| KR | 10-2007-0076860 A | 7/2007 |
| KR | 10-2012-0042037 A | 5/2012 |

OTHER PUBLICATIONS

Provisional double patenting rejection over claims of the above-identified application; USPTO Office Action dated Oct. 6, 2016, in U.S. Appl. No. 14/811,088.

* cited by examiner

ORGANIC LIGHT EMITTING DIODE DISPLAY COMPRISING INTERLAYER INSULATING LAYERS

CROSS-REFERENCE TO RELATED APPLICATION

Korean Patent Application No. 10-2014-0164742, filed on Nov. 24, 2014, in the Korean Intellectual Property Office, and entitled: "Organic Light Emitting Diode Display," is incorporated by reference herein in its entirety.

BACKGROUND

1. Field

Embodiments relate to an organic light emitting diode display, and more particularly, to an organic light emitting diode display including a plurality of thin film transistors.

2. Description of the Related Art

Generally, as a representative example of a flat panel display, there are an organic light emitting diode display, a liquid crystal display, and a plasma display panel, and the like. Among these, the organic light emitting diode display includes a plurality of thin film transistors, a capacitor, and a plurality of wirings.

Recently, the organic light emitting diode display is manufactured to have a high resolution and a large area, and thus the number of thin film transistors configuring one pixel which is a minimum unit displaying an image is increased and the number of wirings passing through one pixel is increased.

SUMMARY

An exemplary embodiment provides an organic light emitting diode display, including: a substrate, a first thin film transistor including a first active pattern on the substrate and a first gate electrode which is positioned on the first active pattern; a data wire on the first gate electrode, a first interlayer insulating layer between the first gate electrode and the data wire, a second interlayer insulating layer between the first interlayer insulating layer and the data wire; and an organic light emitting diode positioned on the data wire and connected to the first active pattern.

At least any one of the first interlayer insulating layer and the second interlayer insulating layer may be an organic layer or an inorganic layer.

At least any one of the first interlayer insulating layer and the second interlayer insulating layer may be an organic layer and another one thereof may be an inorganic layer.

The data wire may include a gate bridge which contacts the first gate electrode through the first interlayer insulating layer and the second interlayer insulating layer.

The first interlayer insulating layer may include a first contact hole through which the gate bridge passes, and the second interlayer insulating layer may include a second contact hole through which the gate bridge passes.

The first interlayer insulating layer may be an inorganic layer and the second interlayer insulating layer may be an organic layer.

The first contact hole of the first interlayer insulating layer may be formed by etching and the second contact hole of the second interlayer insulating layer may be formed by exposure and development.

The first interlayer insulating layer may be an organic layer and the second interlayer insulating layer may be an inorganic layer.

The second contact hole of the second interlayer insulating layer may be formed by etching and the first contact hole of the first interlayer insulating layer may be formed by etching using the second interlayer insulating layer as a mask.

The organic light emitting diode display may further include: a second thin film transistor including a second active pattern which is connected to the first active pattern and a second gate electrode on the second active pattern; a third thin film transistor including a third active pattern which contacts the gate bridge to connect between the first active pattern and the first gate electrode and a third gate electrode on the third active pattern; and a first scan line on the second active pattern to cross the second active pattern and the third active pattern, respectively, and connected to the second gate electrode and the third gate electrode, wherein the data wire may include: a data line being adjacent to the gate bridge on the first scan line to cross the first scan line and connected to the second active pattern; and a driving power line being adjacent to the data line on the first scan line to cross the first scan line and connected to the first active pattern.

The organic light emitting diode display may further include: a capacitor electrode positioned between the first gate electrode and the first interlayer insulating layer to be connected to the driving power line through the first interlayer insulating layer and the second interlayer insulating layer and overlapping the first gate electrode to form a capacitor along with the first gate electrode.

The first gate electrode and the capacitor electrode may be each made of metal.

The capacitor electrode may include an opening through which a portion of the first gate electrode is exposed and the gate bridge may be connected to the first gate electrode through the opening.

The first active pattern, the second active pattern, and the third active pattern may each be on the same layer, and the data line, the driving power line, and the gate bridge may each be on the same layer.

The organic light emitting diode display may further include: a fourth thin film transistor including a fourth active pattern which is connected to the first gate electrode and a third active pattern and a fourth gate electrode which is on the fourth active pattern; a second scan line on the fourth active pattern to cross the fourth active pattern and connected to the fourth gate electrode; and an initialization power line on the second scan line and connected to the fourth active pattern.

The first gate electrode, the second gate electrode, the third gate electrode, the fourth gate electrode, the first scan line, and the second scan line may each be on the same layer.

The organic light emitting diode display may further include: a seventh thin film transistor including a seventh active pattern which is connected to the fourth active pattern and a seventh gate electrode which is positioned on the seventh active pattern; and a third scan line positioned on the seventh active pattern to cross the seventh active pattern and connected to the seventh gate electrode.

The organic light emitting diode display may further include: a fifth thin film transistor including a fifth active pattern which connects between the first active pattern and the driving power line and a fifth gate electrode which is positioned on the fifth active pattern; a sixth thin film transistor including a sixth active pattern which connects between the first active pattern and the organic light emitting diode and a sixth gate electrode which is positioned on the sixth active pattern; and a light emitting control line positioned on the fifth active pattern and the sixth active pattern to cross the fifth active pattern and the sixth active pattern, respectively and connected to the fifth gate electrode and the sixth gate electrode, respectively.

The first gate electrode, the second gate electrode, the third gate electrode, the fifth gate electrode, the sixth gate electrode, the light emitting control line may be each positioned on the same layer.

A channel region of the first active pattern overlapping the first gate electrode may be bent at least once and may extend.

The second interlayer insulating layer may have a lower dielectric constant than the first interlayer insulating layer.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Portions unrelated to the description will be omitted in order to obviously describe the embodiments, and same or similar components will be denoted by the same reference numerals throughout the present specification.

In addition, in several exemplary embodiments, components having the same configuration will be representatively described using the same reference numerals in an exemplary embodiment, and only components different from those of an exemplary embodiment will be described in the other exemplary embodiments.

In addition, since sizes and thicknesses of the respective components shown in the accompanying drawings are arbitrarily shown for convenience of explanation, embodiments are not necessarily limited to contents shown in the accompanying drawings.

In the drawings, the thickness of layers, regions, etc., are exaggerated for clarity. In addition, in the accompanying drawings, thicknesses of some of layers and regions have been exaggerated. It will be understood that when an element such as a layer, a film, a region, or a plate is referred to as being "on" another element, it may be directly on another element or may have an intervening element present therebetween.

Further, throughout the present specification, unless explicitly described to the contrary, "comprising" any components will be understood to imply the inclusion of other elements rather than the exclusion of any other elements. In addition, throughout the specification, the word "on" does not necessarily mean that any element is positioned at an upper side based on a gravity direction, but means that any element is positioned above or below a target portion.

Hereinafter, a display light emitting diode display according to an exemplary embodiment will be described with reference to FIGS. 1 to 3.

Next, a pixel circuit of the organic light emitting diode display according to the exemplary embodiment will be described with reference to FIG. 1. Here, the pixel may mean a minimum unit displaying an image.

Figure 1:
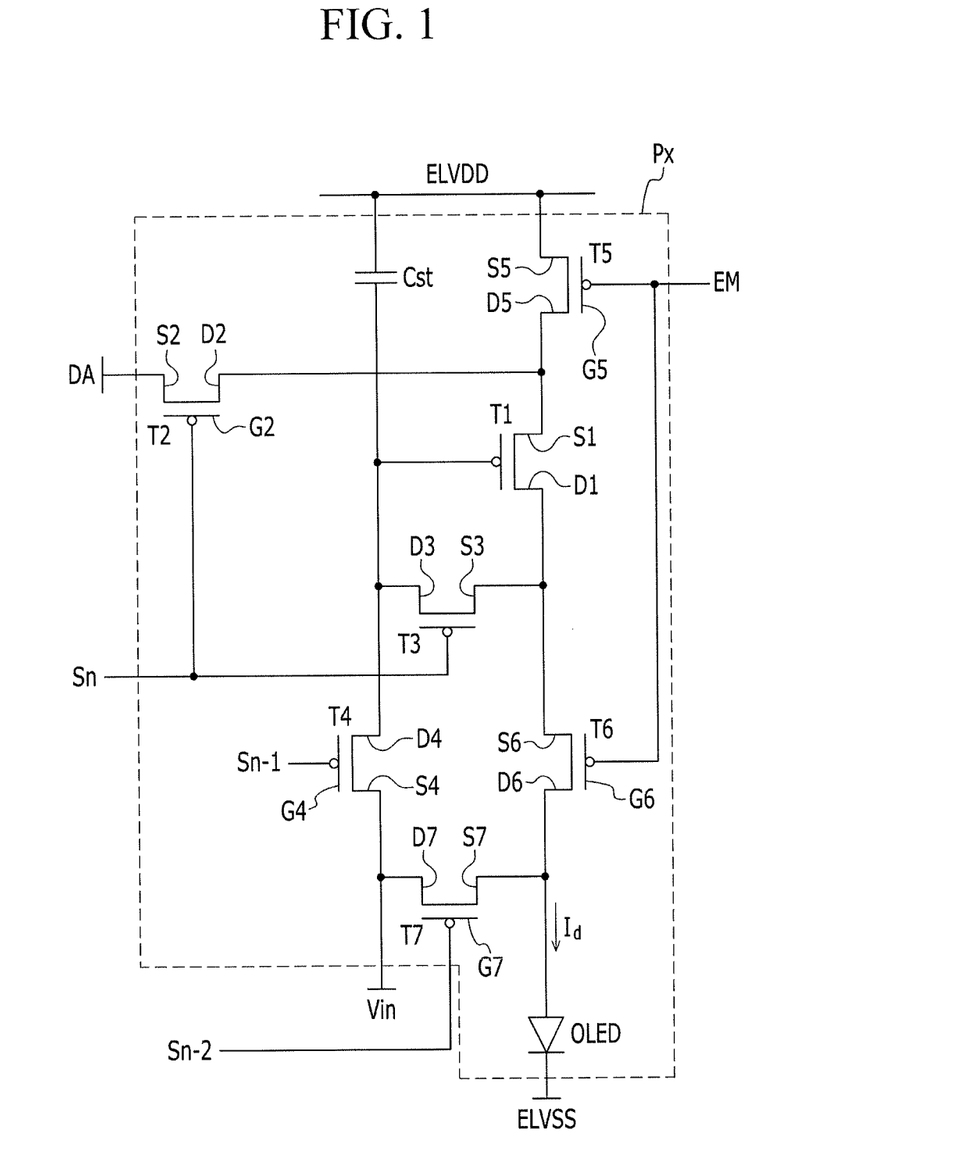
FIG. 1 illustrates a circuit diagram of a pixel of an organic light emitting diode display according to an exemplary embodiment.

FIG. 1 illustrates a circuit diagram of a pixel of an organic light emitting diode display according to an exemplary embodiment. As illustrated in FIG. 1, a pixel Px of the organic light emitting diode display according to the exemplary embodiment includes a plurality of thin film transistors T1, T2, T3, T4, T5, T6, and T7, a plurality of wirings Sn, Sn-1, Sn-2, EM, Vin, DA, and ELVDD, which are connected to the plurality of thin film transistors T1, T2, T3, T4, T5, T6, and T7, a capacitor Cst, and an organic light emitting diode (OLED).

The plurality of thin film transistors T1, T2, T3, T4, T5, T6, and T7 include a first thin film transistor T1, a second thin film transistor T2, a third thin film transistor T3, a fourth thin film transistor T4, a fifth thin film transistor T5, a sixth thin film transistor T6, and a seventh thin film transistor T7.

The first thin film transistor T1 has a first gate electrode G1 connected to a third drain electrode D3 of the third thin film transistor T3 and a fourth drain electrode D4 of the fourth thin film transistor T4, respectively, a first source electrode Si connected to a second drain electrode D2 of the second thin film transistor T2 and a fifth drain electrode D5 of the fifth thin film transistor T5, and a first drain electrode D1 connected to a third source electrode S3 of the third thin film transistor T3 and a sixth source electrode S6 of the sixth thin film transistor T6, respectively.

The second thin film transistor T2 has a second gate electrode G2 connected to a first scan line Sn, the second source electrode S2 connected to a data line DA, and the second drain electrode D2 connected to the first source electrode S1 of the first thin film transistor T1.

The third thin film transistor T3 has a third gate electrode G3 connected to the first scan line Sn, the third source electrode S3 is connected to the first drain electrode D1 of the first thin film transistor T1, and the third drain electrode D3 is connected to the first gate electrode G1 of the first thin film transistor T1.

The fourth thin film transistor T4 has a fourth gate electrode G4 connected to a second scan line Sn-1, a fourth source electrode S4 connected to an initialization power line Vin, and a fourth drain electrode D4 connected to the first gate electrode G1 of the first thin film transistor T1.

The fifth thin film transistor T5 has a fifth gate electrode G5 connected to a light emitting control line EM, a fifth source electrode S5 is connected to a driving power line ELVDD, and the fifth drain electrode D5 is connected to the first source electrode S1 of the first thin film transistor T1.

The sixth thin film transistor T6 has a sixth gate electrode G6 connected to the light emitting control line EM and a sixth source electrode S6 connected to the first drain electrode D1 of the first thin film transistor T1.

The seventh thin film transistor T7 has a seventh gate electrode G7 connected to a third scan line Sn-2, a seventh source electrode S7 connected to an organic light emitting diode (OLED), and a seventh drain electrode D7 connected to the fourth source electrode S4 of the fourth thin film transistor T4.

The plurality of wirings include the first scan line Sn, which transfers a first scan signal to the second gate electrode G2 and the third gate electrode G3 of the second thin film transistor T2 and the third thin film transistor T3, respectively, the second scan line Sn-1, which transfers a second scan signal to the fourth gate electrode G4 of the fourth thin film transistor T4, the third scan line Sn-2, which transfers a third scan signal to the seventh gate electrode G7 of the seventh thin film transistor T7, the light emitting control line EM, which transfers a light emitting control signal to each of the fifth gate electrode G5 and the sixth gate electrode G6 of the fifth thin film transistor T5 and the sixth thin film transistor T6, respectively, a data line DA, which transfers a data signal to the second source electrode S2 of the second thin film transistor T2, the driving power line ELVDD, which supplies a driving signal to one electrode of the capacitor Cst and the fifth source electrode S5 of the fifth thin film transistor T5, respectively, and the initialization power line Vin, which supplies an initialization signal to the fourth source electrode S4 of the fourth thin film transistor T4. The data line DA and the driving power line ELVDD may be formed as a data wire.

The capacitor Cst includes a first electrode connected to the driving power line ELVDD and a second electrode connected to the first gate electrode G1 and the third drain electrode D3 of the third thin film transistor T3, respectively.

The organic light emitting diode (OLED) includes a first electrode, a second electrode on the first electrode, and an organic light emitting layer between the first electrode and the second electrode. The first electrode of the organic light emitting diode (OLED) is connected to the seventh source electrode S7 of the seventh thin film transistor T7 and the sixth drain electrode D6 of the sixth thin film transistor T6, respectively, and the second electrode is connected to a common power supply ELVSS to which a common signal is transferred.

As one example of driving the pixel circuit, first, when the third scan signal is transferred to the third scan line Sn-2, turning on the seventh thin film transistor T7, a residual current flowing in the first electrode of the organic light emitting diode (OLED) exits to the fourth thin film transistor T4 through the seventh thin film transistor T7, such the organic light emitting diode (OLED) may be prevented from unintentionally emitting light due to the residual current flowing in the first electrode of the organic light emitting diode (OLED).

Next, when the second scan signal is transferred to the second scan line Sn-1 and the initialization signal is transferred to the initialization power line Vin, the fourth thin film transistor T4 is turned on and, thus, the initialization voltage by the initialization signal is supplied to the first gate electrode G1 of the first thin film transistor T1 and the second electrode of the capacitor Cst, such that the first gate electrode G1 and the capacitor Cst are initialized. In this case, the first thin film transistor T1 is turned on while the first gate electrode G1 is initialized.

Next, when the first scan signal is transferred to the first scan line Sn and the data signal is transferred to the data line DA, the second thin film transistor T2 and the third thin film transistor T3 are each turned on and thus a data voltage Vd by the data signal is supplied to the first gate electrode G1 through the second thin film transistor T2, the first thin film transistor T1, and the third thin film transistor T3. In this case, as the voltage supplied to the first gate electrode G1, a compensation voltage {Vd+Vth, in which Vth is a negative (−) value} which is reduced as much as a threshold voltage Vth of the first thin film transistor T1 from the data voltage Vd which is supplied from a first data line Da is supplied to the first gate electrode G1. The compensation voltage Vd+Vth which is supplied to the first gate electrode G1 is also supplied to the second electrode of the capacitor Cst which is connected to the first gate electrode G1.

Next, the first electrode of the capacitor Cst is supplied with a driving voltage Vel by a driving signal from the driving power line ELVDD and the second electrode thereof is supplied with the above compensation voltage Vd+Vth. Thus, the capacitor Cst stores charges that correspond to a difference between voltages applied to the first and second electrodes thereof, respectively, such that the first thin film transistor T1 is turned on for a predetermined time.

Next, when the light emitting control signal is applied to the light emitting control line EM, the fifth thin film transistor T5 and the sixth thin film transistor T6 are each turned on. Thus, the driving voltage Vel of the driving signal is supplied from the driving power line ELVDD to the first thin film transistor T1 through the fifth thin film transistor T5.

Then, a driving current Id, which corresponds to a difference between the voltage supplied to the first gate electrode G1 by the capacitor Cst and the driving voltage Vel, flows in the first drain electrode D1 of the first thin film transistor T1 while the driving voltage Vel passes through the first thin film transistor T1, which is turned on by the capacitor Cst, and the driving current Id is supplied to the organic light emitting diode (OLED) through the sixth thin film transistor T6, such that the organic light emitting diode (OLED) emits light for a predetermined time.

While the particular configuration of the pixel circuit illustrated in FIG. 1 includes the first thin film transistor T1 to the seventh thin film transistor T7, the capacitor Cst, the first scan line Sn to the third scan line Sn-2, the data line DA, the driving power line ELVDD, and the initialization power line Vin, embodiments are not limited thereto, and a pixel circuit of an organic light emitting diode display according to another exemplary embodiment may include at least two thin film transistors, at least one capacitor, and wirings including at least one scan line and at least one driving power line.

Hereinafter, a disposition of the pixel of the organic light emitting diode display as described above according to an exemplary embodiment will be described with reference to FIGS. 2 and 3. Insulating layers are between components that are on different layers to be described below, in which the insulating layer may be an inorganic insulating layer or an organic insulating layer, e.g., silicon nitride, silicon oxide, or the like. Further, the insulating layers may be formed of a single layer or a multilayer.

Figure 2:
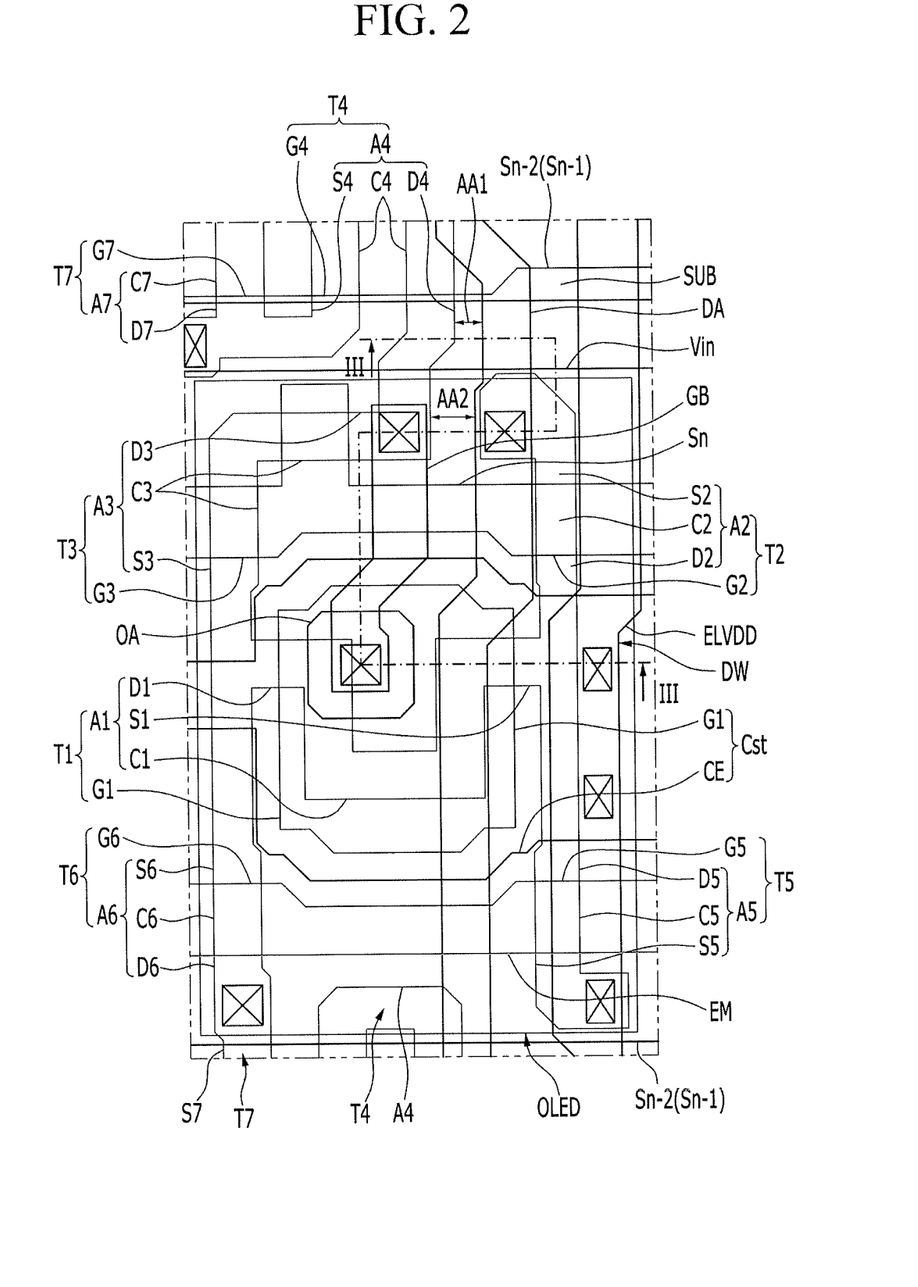
FIG. 2 illustrates a layout view of the pixel of the organic light emitting diode display according to the exemplary embodiment.

FIG. 2 illustrates a layout view of the pixel of the organic light emitting diode display according to the exemplary embodiment. FIG. 3 is a cross-sectional view taken along line III-III of FIG. 2.

Figure 3:
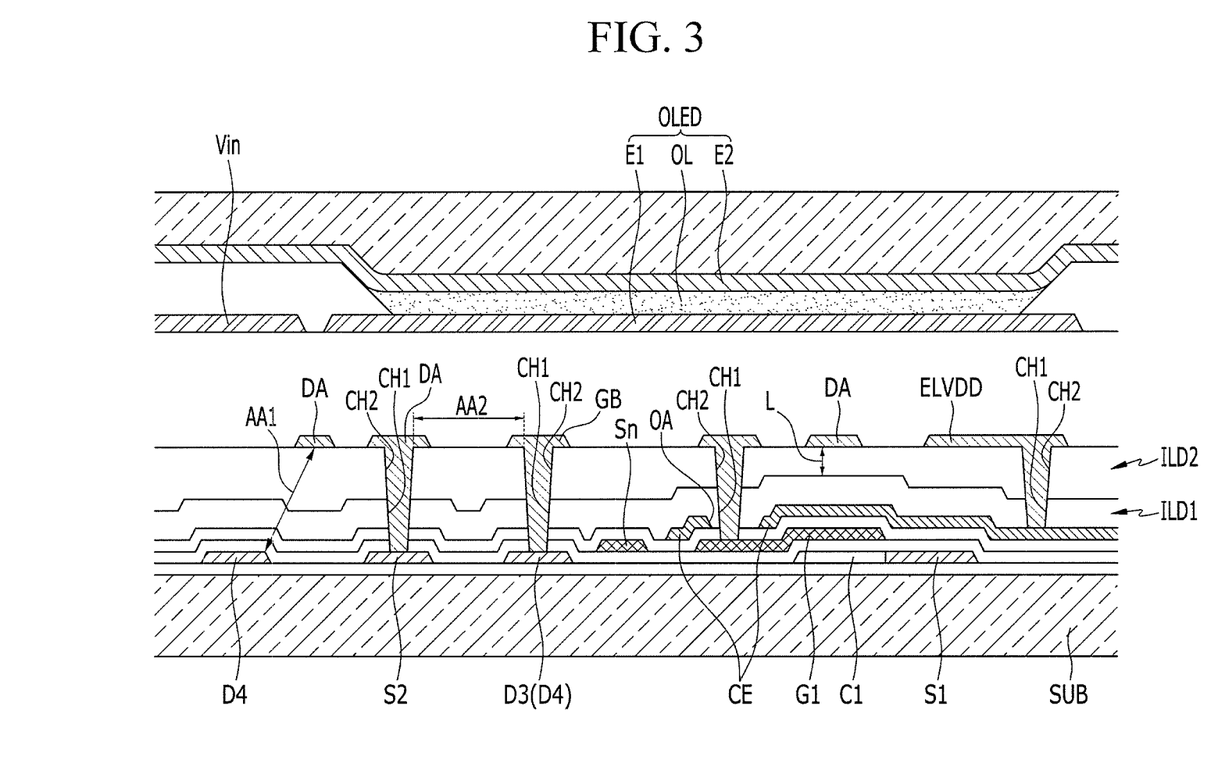
FIG. 3 illustrates a cross-sectional view taken along line III-III of FIG. 2.

As illustrated in FIGS. 2 and 3, the organic light emitting diode display according to the exemplary embodiment includes a substrate (SUB), the first thin film transistor T1, the second thin film transistor T2, the third thin film transistor T3, the fourth thin film transistor T4, the fifth thin film transistor T5, the sixth thin film transistor T6, the seventh thin film transistor T7, the first scan line Sn, the second scan line Sn-1, the third scan line Sn-2, the light emitting control line EM, the capacitor Cst, the data line DA, the driving power line ELVDD, and the gate bridge GB which are the data wire DW, a first interlayer insulating layer ILD1, a second interlayer insulating layer ILD2, the initialization power line Vin, and the organic light emitting diode (OLED).

In FIG. 2, the second scan line Sn-1 and the third scan line Sn-2 are illustrated as one scan line, but embodiments are not limited thereto, e.g., the second scan line Sn-1 and the third scan line Sn-2 may be positioned as respective scan lines separated from each other.

The substrate SUB may be made of glass, quartz, ceramic, sapphire, plastic, metal, and the like, and may be flexible, stretchable, rollable, or foldable, and so forth. When the substrate (SUB) is flexible, stretchable, rollable, or foldable, the organic light emitting diode display may be flexible, stretchable, rollable, or foldable on the whole.

The first thin film transistor T1 is on the substrate (SUB) and includes the first active pattern A1 and the first gate electrode G1.

The first active pattern A1 includes the first source electrode S1, the first channel C1, and first drain electrode D1. The first source electrode S1 is connected to the second drain electrode D2 of the second thin film transistor T2 and the fifth drain electrode D5 of the fifth thin film transistor T5, respectively. The first drain electrode D1 is connected to the third source electrode S3 of the third thin film transistor T3 and the sixth source electrode S6 of the sixth thin film transistor T6, respectively.

The first channel C1, which is a channel region of the first active pattern A1 overlapping the first gate electrode G1, is bent at least once and extends within a space overlapping the first gate electrode G1, which is a limited space. Thus, the length of the first channel C1 may be increased, such that a driving range of a gate voltage applied to the first gate electrode G1 may be increased. As a result, a magnitude of the gate voltage applied to the first gate electrode G1 is changed within the increased driving range to more precisely control a gray scale of light emitted from the organic light emitting diode (OLED), thereby improving image quality displayed by the organic light emitting diode display. A shape of the first active pattern A1 may be variously changed and may be include various forms, e.g., 'inverse S', 'S', 'M', 'W', and so forth.

The first active pattern A1 may be made of polysilicon or oxide semiconductor. The oxide semiconductor may include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and a zinc oxide (ZnO), an indium-gallium-zinc oxide (InGaZnO4), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. When the first active pattern A1 is made of the oxide semiconductor, a separate protecting layer may be added in order to protect the oxide semiconductor, which is vulnerable to external environmental conditions, e.g., high temperatures.

The first channel C1 of the first active pattern A1 may be channel-doped with N type impurities or P type impurities, and the first source electrode S1 and the first drain electrode D1 may be spaced apart from each other, having the first channel C1 therebetween. The first source electrode S1 and the first drain electrode D1 may each be doped with doping impurities having an opposite type to the doping impurities doped in the first channel C1.

The first gate electrode G1 may be on the first channel C1 of the first active pattern A1 and may have an island shape. The first gate electrode G1 may be connected to the fourth drain electrode D4 of the fourth thin film transistor T4 and the third drain electrode D3 of the third thin film transistor T3 by the gate bridge GB which passes through a contact hole of a first contact hole CH1 of the first interlayer insulating layer ILD1 and a second contact hole CH2 of the second interlayer insulating layer ILD2. The first gate electrode G1 overlaps a capacitor electrode CE and may also serve as the second electrode of the capacitor Cst simultaneously while serving as the gate electrode of the first thin film transistor T1. That is, the first gate electrode G1 and the capacitor electrode CE together form the capacitor Cst. The first gate electrode G1 may be made of metal.

The second thin film transistor T2 is positioned on the substrate (SUB) and includes the second active pattern A2 and the second gate electrode G2.

The second active pattern A2 includes the second source electrode S2, the second channel C2, and the second drain electrode D2. The second source electrode S2 is connected to the data line DA through the contact hole that includes a first contact hole CH1 of a first interlayer insulating layer ILD1 and a second contact hole CH2 of a second interlayer insulating layer ILD2. The second drain electrode D2 is connected to the first source electrode S1 of the first thin film transistor T1. The second channel C2, which is a channel region of the second active pattern A2, overlaps the second gate electrode G2 and is between the second source electrode S2 and the second drain electrode D2. That is, the second active pattern A2 is connected to the first active pattern A1.

The second channel C2 of the second active pattern A2 may be channel-doped with N type impurities or P type impurities. The second source electrode S2 and the second drain electrode D2 are spaced apart from each other with the second channel C2 therebetween, and may each be doped with doping impurities having an opposite type to the doping impurities doped in the second channel C2. The second active pattern A2 may be on the same layer as the first active pattern A1, made of the same material as the first active pattern A1, and integrally formed with the first active pattern A1.

The second gate electrode G2 may be on the second channel C2 of the second active pattern A2 and integrally formed with the first scan line Sn.

The third thin film transistor T3 may be on the substrate SUB and includes a third active pattern A3 and the third gate electrode G3. The third active pattern A3 includes the third source electrode S3, a third channel C3, and the third drain electrode D3. The third source electrode S3 is connected to the first drain electrode D1 and the third drain electrode D3 is connected to the first gate electrode G1 of the first thin film transistor T1 by a gate bridge GB which passes through the contact hole that includes the first contact hole CH1 of the first interlayer insulating layer ILD1 and the second contact hole CH2 of the second interlayer insulating layer ILD2. The third channel C3, which is a channel region of the third active pattern A3, overlaps the third gate electrode G3 and is between the third source electrode S3 and the third drain electrode D3. That is, the third active pattern A3 connects the first active pattern A1 and the first gate electrode G1.

The third channel C3 of the third active pattern A3 may be channel-doped with N type impurities or P type impurities. The third source electrode S3 and the third drain electrode D3 are spaced apart from each other with the third channel C3 therebetween and may each be doped with doping impurities having an opposite type to the doping impurities doped in the third channel C3. The third active pattern A3 may be on the same layer as the first active pattern A1 and the second active pattern A2, made of the same material as the first active pattern A1 and the second active pattern A2, and integrally formed with the first active pattern A1 and the second active pattern A2.

The third gate electrode G3 may be on the third channel C3 of the third active pattern A3 and integrally formed with the first scan line Sn. The third gate electrode G3 may be a dual gate electrode.

The fourth thin film transistor T4 may be on the substrate SUB and includes a fourth active pattern A4 and the fourth gate electrode G4. The fourth active pattern A4 includes the fourth source electrode S4, a fourth channel C4, and the fourth drain electrode D4. The fourth source electrode S4 is connected to the initialization power line Vin through the contact hole, the fourth drain electrode D4 is connected to the first gate electrode G1 of the first thin film transistor T1 by the gate bridge GB which passes through the contact hole which includes the first contact hole CH1 of the first interlayer insulating layer ILD1 and the second contact hole CH2 of the second interlayer insulating layer ILD2. The fourth channel C4, which is a channel region of the fourth active pattern A4, overlaps the fourth gate electrode G4 and is between the fourth source electrode S4 and the fourth drain electrode D4. That is, the fourth active pattern A4 is connected to the third active pattern A3 and the first gate electrode G1, respectively, simultaneously with connecting between the initialization power line Vin and the first gate electrode G1.

The fourth channel C4 of the fourth active pattern A4 may be channel-doped with N type impurities or P type impurities. The fourth source electrode S4 and the fourth drain electrode D4 are spaced apart from each other with the fourth channel C4 therebetween and may each be doped with doping impurities having an opposite type to the doping impurities doped in the fourth channel C4. The fourth active pattern A4 may be on the same layer as the first active pattern A1, the second active pattern A2, the third active pattern A3, made of the same material as the first active pattern A1, the second active pattern A2, and the third active pattern A3, and integrally formed with the first active pattern A1, the second active pattern A2, and the third active pattern A3.

The fourth gate electrode G4 may be on the fourth channel C4 of the fourth active pattern A4 and integrally formed with the second scan line Sn-1. The fourth gate electrode G4 may be a dual gate electrode.

The fifth thin film transistor T5 may be on the substrate SUB and includes a fifth active pattern A5 and the fifth gate electrode G5. The fifth active pattern A5 includes the fifth source electrode S5, a fifth channel C5, and the fifth drain electrode D5

The fifth source electrode S5 is connected to the driving power line ELVDD through the contact hole that includes the first contact hole CH1 of the first interlayer insulating layer ILD1 and the second contact hole CH2 of the second interlayer insulating layer ILD2. The fifth drain electrode D5 is connected to the first source electrode S1 of the first thin film transistor T1. The fifth channel C5, which is a channel region of the fifth active pattern A5, overlaps the fifth gate electrode G5 and is between the fifth source electrode S5 and the fifth drain electrode D5. That is, the fifth active pattern A5 connects between the driving power line ELVDD and the first active pattern A1.

The fifth channel C5 of the fifth active pattern A5 may be channel-doped with N type impurities or P type impurities. The fifth source electrode S5 and the fifth drain electrode D5 are spaced apart from each other with the fifth channel C5 therebetween and may each be doped with doping impurities having an opposite type to the doping impurities doped in the fifth channel C5. The fifth active pattern A5 may be on the same layer as the first active pattern A1, the second active pattern A2, the third active pattern A3, and the fourth active pattern A4, made of the same material as the first active pattern A1, the second active pattern A2, the third active pattern A3, and the fourth active pattern A4, and integrally formed with the first active pattern A1, the second active pattern A2, the third active pattern A3, and the fourth active pattern A4.

The fifth gate electrode G5 is positioned on the fifth channel C5 of the fifth active pattern A5 and integrally formed with the light emitting control line EM.

The sixth thin film transistor T6 may be on the substrate (SUB) and includes the sixth active pattern A6 and the sixth gate electrode G6. The sixth active pattern A6 includes the sixth source electrode S6, a sixth channel C6, and the sixth drain electrode D6. The sixth source electrode S6 is connected to the first drain electrode D1 of the first thin film transistor T1 and the sixth drain electrode D6 is connected to the first electrode E1 of the organic light emitting diode (OLED) through the contact hole. The sixth channel C6, which is a channel region of the sixth active pattern A6, overlaps the sixth gate electrode G6 and is between the sixth source electrode S6 and the sixth drain electrode D6. That is, the sixth active pattern A6 connects between the first active pattern A1 and the first electrode E1 of the organic light emitting diode (OLED).

The sixth channel C6 of the sixth active pattern A6 may be channel-doped with N type impurities or P type impurities. The sixth source electrode S6 and the sixth drain electrode D6 are spaced apart from each other with the sixth channel C6 therebetween and may each be doped with doping impurities having an opposite type to the doping impurities doped in the sixth channel C6. The sixth active pattern A6 may be on the same layer as the first active pattern A1, the second active pattern A2, the third active pattern A3, the fourth active pattern A4, and the fifth active pattern A5, made of the same material as the first active pattern A1, the second active pattern A2, the third active pattern A3, the fourth active pattern A4, and the fifth active pattern A5, and integrally formed with the first active pattern A1, the second active pattern A2, the third active pattern A3, the fourth active pattern A4, and the fifth active pattern A5.

The sixth gate electrode G6 may be on the sixth channel C6 of the sixth active pattern A6 and integrally formed with the light emitting control line EM.

The seventh thin film transistor T7 may be on the substrate (SUB) and includes the seventh active pattern A7 and the seventh gate electrode G7. The seventh active pattern A7 includes the seventh source electrode S7, a seventh channel C7, and the seventh drain electrode D7. The seventh source electrode S7 is connected to the first electrode of the organic light emitting diode of another pixel (pixel positioned over the pixel of FIG. 2, not illustrated in FIG. 2) and the seventh drain electrode D7 is connected to the fourth source electrode S4 of the fourth thin film transistor T4. The seventh channel C7, which is a channel region of the seventh active pattern A7, overlaps the seventh gate electrode G7 and is between the seventh source electrode S7 and the seventh drain electrode D7. That is, the seventh active pattern A7 connects between the first electrode and the fourth active pattern A4 of the organic light emitting diode.

The seventh channel C7 of the seventh active pattern A7 may be channel-doped with N type impurities or P type impurities. The seventh source electrode S7 and the seventh drain electrode D7 are spaced apart from each other with the seventh channel C7 therebetween and may each be doped with doping impurities having an opposite type to the doping impurities doped in the seventh channel C7. The seventh active pattern A7 may be on the same layer as the first active pattern A1, the second active pattern A2, the third active pattern A3, the fourth active pattern A4, the fifth active pattern A5, and the sixth active pattern A6, made of the same material as the first active pattern A1, the second active pattern A2, the third active pattern A3, the fourth active pattern A4, the fifth active pattern A5, and the sixth active pattern A6, and integrally formed with the first active pattern A1, the second active pattern A2, the third active pattern A3, the fourth active pattern A4, the fifth active pattern A5, and the sixth active pattern A6.

The seventh gate electrode G7 may be on the seventh channel C7 of the seventh active pattern A7 and integrally formed with the third scan line Sn-2.

The first scan line Sn may be on the second active pattern A2 and the third active pattern A3 and extends in a first direction crossing the second active pattern A2 and the third active pattern A3. The first scan line Sn is connected to the second gate electrode G2 and the third gate electrode G3, being integrally formed with the second gate electrode G2 and the third gate electrode G3.

The second scan line Sn-1 may be on the fourth active pattern A4, being spaced apart from the first scan line Sn along a second direction, and extends in the first direction crossing the fourth active pattern A4. The second scan line Sn-2 is connected to the fourth gate electrode G4, being integrally formed with the fourth gate electrode G4. The second scan line Sn-1 is shown herein as being integrally formed with the third scan line Sn-2, but is not limited thereto and may be formed as a different line from the third scan line Sn-2.

The third scan line Sn-2 may be on the seventh active pattern A7, being spaced apart from the second scan line Sn-1 along the second direction, and extends in the first direction crossing the seventh active pattern A7. The third scan line Sn-2 is connected to the seventh gate electrode G7, being integrally formed with the seventh gate electrode G7. The third scan line Sn-2 is integrally formed with the second scan line Sn-1, but is not limited thereto and may be formed as a different line from the second scan line Sn-1.

The light emitting control line EM may be on the fifth active pattern A5 and the sixth active pattern A6, being spaced apart from the first scan line Sn along the second direction, and extends in the first direction crossing the fifth active pattern A5 and the sixth active pattern A6. The light emitting control line EM is connected to the fifth gate electrode G5 and the sixth gate electrode G6, being integrally formed with the fifth gate electrode G5 and the sixth gate electrode G6.

As described above, the light emitting control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 are positioned on the same layer and made of the same material. For example, the light emitting control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 may form the first gate wire.

Alternatively, the light emitting control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 may each be selectively positioned on different layers and/or made of different materials.

The capacitor Cst includes the first electrode and the second electrode that face each other and have the insulating layer therebetween. The first electrode may be the capacitor electrode CE and the second electrode may be the first gate electrode G1. The capacitor electrode CE may be on the first gate electrode G1 and connected to the driving power line ELVDD through the contact hole that includes the first contact hole CH1 of the first interlayer insulating layer ILD1 and the second contact hole CH2 of the second interlayer insulating layer ILD2. The capacitor electrode CE may overlap the first gate electrode G1 on the first gate electrode G1.

The capacitor electrode CE forms the capacitor Cst along with the first gate electrode G1 and the first gate electrode G1 and the capacitor electrode CE may each be made of different materials or the same material on different layers. The capacitor electrode CE extends in one direction and crosses a plurality of adjacent pixels Pxs. The capacitor electrode CE may formed a second gate wire on the above-mentioned first gate wire.

The capacitor electrode CE includes an opening OA through which a portion of the first gate electrode G1 is exposed. The gate bridge GB is connected to the first gate electrode G1 through the opening OA and the contact hole that includes the first contact hole CH1 of the first interlayer insulating layer ILD1 and the second contact hole CH2 of the second interlayer insulating layer ILD2.

A data wire DW is on the first gate wire including the first gate electrode G1 and the second gate wire including the capacitor electrode CE, and includes the data line DA, the driving power line ELVDD, and the gate bridge GB. The data line DA is on the first scan line Sn, being adjacent to the gate bridge GB and extends in the second direction crossing the first scan line Sn. The data line DA is connected to the second source electrode S2 of the second active pattern A2 through the contact hole that includes the first contact hole CH1 of the first interlayer insulating layer ILD1 and the second contact hole CH2 of the second interlayer insulating layer ILD2. The data line DA crosses the first scan line Sn, the second scan line Sn-1, the third scan line Sn-2, and the light emitting control line EM.

The driving power line ELVDD is on the first scan line Sn adjacent to the data line DA and extends in the second direction crossing the first scan line Sn. The driving power line ELVDD is connected to the fifth source electrode S5 of the fifth active pattern A5 which is connected to the capacitor electrode CE and the first active pattern A1 through the contact hole that include the first contact hole CH1 of the first interlayer insulating layer ILD1 and the second contact hole CH2 of the second interlayer insulating layer ILD2. The driving power line ELVDD extends along the second direction crossing the first scan line Sn, the second scan line Sn-1, the third scan line Sn-2, and the light emitting control line EM.

The gate bridge GB is on the first scan line Sn adjacent to the data line DA and is spaced apart from the driving power line ELVDD, having the data line DA therebetween. The gate bridge GB is connected to the third drain electrode D3 of the third active pattern A3 and the fourth drain electrode D4 of the fourth active pattern A4, respectively, through the contact hole that includes the first contact hole CH1 of the first interlayer insulating layer ILD1 and the second contact hole CH2 of the second interlayer insulating layer ILD2 and, thus, is connected to the first gate electrode G1 exposed by the opening OA of the capacitor electrode CE through the contact hole which is formed of the first contact hole CH1 of the first interlayer insulating layer ILD1 and the second contact hole CH2 of the second interlayer insulating layer ILD2.

As described above, the data line DA, the driving power line ELVDD, and the gate bridge GB are positioned on the same layer and made of the same material to form the data wire DW. Alternatively, according to another exemplary embodiment, the data line DA, the driving power line ELVDD, and the gate bridge GB may each be selectively positioned on different layers and/or may be made of different materials.

The first interlayer insulating layer ILD1 is between the first gate electrode G1 and the data wire DW and may be an inorganic layer. The first interlayer insulating layer ILD1 includes the first contact hole CH1 through which the data wire DW passes. The first contact hole CH1 of the first interlayer insulating layer ILD1 may be formed by a photolithography process including etching.

The second interlayer insulating layer ILD2 is between the first interlayer insulating layer ILD1 and the data wire DW and may be an organic layer. The second interlayer insulating layer ILD2 includes the second contact hole CH2 through which the data wire DW passes. The second contact hole CH2 of the second interlayer insulating layer ILD2 may be formed by the photolithography process including exposure and development.

The data wire DW selectively contacts other wirings through the contact hole that includes the first contact hole CH1 of the first interlayer insulating layer ILD1 and the second contact hole CH2 of the second interlayer insulating layer ILD2. In detail, by the contact hole that includes the first contact hole CH1 of the first interlayer insulating layer ILD1 and the second contact hole CH2 of the second interlayer insulating layer ILD2, the gate bridge GB contacts the first gate electrode G1 and the third drain electrode D3 of the third active pattern A3, the data line DA contacts the second source electrode S2 of the second active pattern A2, and the driving power line ELVDD contacts the fifth source electrode S5 of the fifth active pattern A5 and the capacitor electrode CE, respectively.

Alternatively, according to another exemplary embodiment, at least any one of the first interlayer insulating layer ILD1 and the second interlayer insulating layer ILD2 may be the organic layer or the inorganic layer. Further, according to another exemplary embodiment, any one of the first interlayer insulating layer ILD1 and the second interlayer insulating layer ILD2 may be the organic layer and the other one thereof may be the inorganic layer.

The first interlayer insulating layer ILD1 and the second interlayer insulating layer ILD2 are positioned between the data wire DW and the first gate electrode G1. If the second interlayer insulating layer ILD2 has a lower dielectric constant than the first interlayer insulating layer ILD1, parasitic capacitance is formed in a first region AA1 between the gate bridge GB and the data line DA which are adjacent to each other and a second region AA2 between the fourth drain electrode D4 of the fourth active pattern A4 and the data line DA, respectively, may be suppressed, such that crosstalk from occurring in the gate bridge GB, the data line DA, and the fourth active pattern A4, respectively, may be suppressed.

The first interlayer insulating layer ILD1 and the second interlayer insulating layer ILD2 are between the data wire DW and the capacitor electrode CE. If the second interlayer insulating layer ILD2 is thicker than the inorganic layer first interlayer insulating layer ILD1 along a third direction, a distance L between the capacitor electrode CE and the data wire DW may be increased, such that a short-circuit between the capacitor electrode CE and the data line DA, between the capacitor electrode CE and the driving power line ELVDD, and between the capacitor electrode CE and the gate bridge GB, respectively, may be suppressed.

The initialization power line Vin may be on the second scan line Sn-1 and is connected to the fourth source electrode S4 of the fourth active pattern A4 through the contact hole. The initialization power line Vin may be on the same layer as the first electrode E1 of the organic light emitting diode (OLED) and may be made of the same material. Alternatively, according to another exemplary embodiment, the initialization power line Vin may be positioned on a different layer from the first electrode E1 and/or may be made of different materials.

The organic light emitting diode (OLED) includes the first electrode E1, an organic light emitting layer OL, and the second electrode E2. The first electrode E1 is connected to the sixth drain electrode D6 of the sixth thin film transistor T6 through the contact hole. The organic light emitting layer OL is between the first electrode E1 and the second electrode E2. The second electrode E2 is on the organic light emitting layer OL. At least one of the first electrode E1 and the second electrode E2 may be at least any one of a light transmitting electrode, a light reflective electrode, and a light translucent electrode, and light emitted from the organic light emitting layer OL may be emitted in at least any one direction of the first electrode E1 and the second electrode E2.

A capping layer covering the organic light emitting diode (OLED) may be positioned on the organic light emitting diode (OLED) and a thin film encapsulation may be positioned or an encapsulation substrate may be positioned on the organic light emitting diode (OLED), having the capping layer therebetween.

According to the organic light emitting diode display according to the exemplary embodiment as described above, since one pixel PX is formed of seven thin film transistors and one capacitor, even though the number of wirings passing through the one pixel is increased and, thus, an interval between the wirings is narrow, since the first interlayer insulating layer ILD1 and the second interlayer insulating layer ILD2 between the data wire DW and the first gate electrode G1 include an organic layer having a lower dielectric constant than the inorganic layer, and thus it is suppressed that the parasitic capacitance is formed in the first region AA1 between the gate bridge GB and the data line DA which are adjacent to each other and the second region AA2 between the fourth drain electrode D4 of the fourth active pattern A4 and the data line DA, respectively, such that it is possible to suppress the crosstalk from occurring in the gate bridge GB, the data line DA, and the fourth active pattern A4, respectively.

As a result, since it is suppressed that a signal passing through the data line DA, the gate bridge GB, the fourth active pattern A4 is delayed, the organic light emitting diode display with the improved quality of image on the whole is provided.

Further, according to the organic light emitting diode display according to the exemplary embodiment, the first interlayer insulating layer ILD1 and the second interlayer insulating layer ILD2 are positioned between the data wire DW and the capacitor electrode CE and the second interlayer insulating layer ILD2 is formed of the organic layer which may be formed to have a thicker thickness than the inorganic layer, and thus a distance L between the capacitor electrode CE positioned on the first gate electrode G1 and the data wire DW is long, such that the short-circuit between the capacitor electrode CE and the data line DA, between the capacitor electrode CE and the driving power line ELVDD, and between the capacitor electrode CE and the gate bridge GB, respectively, may be suppressed.

Hereinafter, the organic light emitting diode display according to another exemplary embodiment will be described with reference to FIG. 4. Hereinafter, only components different from those of the organic light emitting diode display according to an exemplary embodiment described above will be described.

Figure 4:
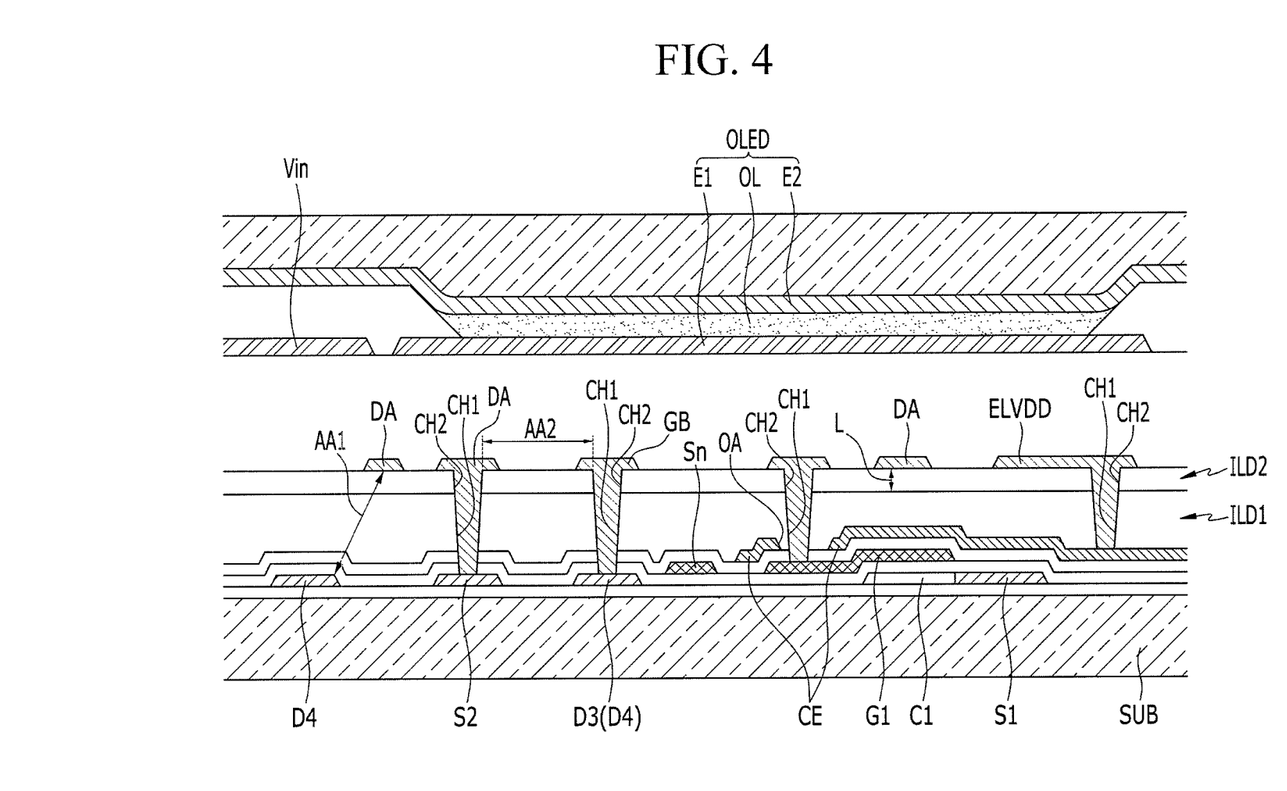
FIG. 4 illustrates a cross-sectional view of an organic light emitting diode display according to another exemplary embodiment.

FIG. 4 illustrates a cross-sectional view of an organic light emitting diode display according to another exemplary embodiment.

As illustrated in FIG. 4, the first interlayer insulating layer ILD1 of the organic light emitting diode display according to another exemplary embodiment is between the first gate electrode G1 and the data wire DW and is formed of the organic layer. The first interlayer insulating layer ILD1 includes the first contact hole through which the data wire DW passes. The first contact hole CH1 of the first interlayer insulating layer ILD1 may be formed by the etching using the second interlayer insulating layer ILD2, on which the second contact hole CH2 is formed, as the mask.

The second interlayer insulating layer ILD2 is between the first interlayer insulating layer ILD1 and the data wire DW, and is formed of the inorganic layer. The second interlayer insulating layer ILD2 includes the second contact hole CH2 through which the data wire DW passes. The second contact hole CH2 of the second interlayer insulating layer ILD2 may be formed by the photolithography process including the etching.

As such, according to the organic light emitting diode display according to another exemplary embodiment, the first interlayer insulating layer ILD1 and the second interlayer insulating layer ILD2 are positioned between the data wire DW and the first gate electrode G1 and the first interlayer insulating layer ILD1 is formed of the organic layer having a lower dielectric constant than the inorganic layer, and thus it is suppressed that the parasitic capacitance is formed in the first region AA1 between the gate bridge GB and the data line DA which are adjacent to each other and the second region AA2 between the fourth drain electrode D4 of the fourth active pattern A4 and the data line DA, respectively, such that it is possible to suppress the crosstalk from occurring in the gate bridge GB, the data line DA, and the fourth active pattern A4, respectively.

Further, according to the organic light emitting diode display according to another exemplary embodiment, the first interlayer insulating layer ILD1 and the second interlayer insulating layer ILD2 are positioned between the data wire DW and the capacitor electrode CE and the first interlayer insulating layer ILD1 is formed of the organic layer which may be formed to have a thicker thickness than the inorganic layer, and thus the distance L between the capacitor electrode CE and the data wire DW is long, such that the short-circuit between the capacitor electrode CE and the data line DA, between the capacitor electrode CE and the driving power line ELVDD, and between the capacitor electrode CE and the gate bridge GB, respectively, may be suppressed.

Further, according to the organic light emitting diode display according to another exemplary embodiment, the first contact hole CH1 of the first interlayer insulating layer ILD1 formed of the organic layer is formed by the etching using the second interlayer insulating layer ILD2, on which the second contact hole CH2 is formed, as the mask, such that the first contact hole CH1 may be formed on the first interlayer insulating layer ILD1 at a designed size without process errors as compared with the process of forming the first contact hole CH1 using the exposure and development.

That is, according to the organic light emitting diode display according to another exemplary embodiment, by reflecting that since the one pixel is formed of 7 thin film transistors and one capacitor, the number of wirings passing through the one pixel is increased and thus the interval between the wiring is narrow, and at the same time, the width of the wiring itself is narrow, even though the first interlayer insulating layer ILD1 is formed of the organic layer with process errors as compared with the inorganic layer, the first contact hole CH1 of the first interlayer insulating layer ILD1 formed of the organic layer is formed by the etching process using the second interlayer insulating layer ILD2, on which the second contact hole CH2 is formed, as the mask, such that the first contact hole CH1 of the first interlayer insulating layer ILD1 is formed to have the designed size without the process errors.

By way of summation and review, one or more embodiments provide the organic light emitting diode display capable of minimizing crosstalk between the wirings passing through one pixel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
a substrate;
a first thin film transistor including a first active pattern on the substrate and a first gate electrode on the first active pattern;
a capacitor electrode on the first gate electrode;
a first interlayer insulating layer on the capacitor electrode;
a second interlayer insulating layer on the first interlayer insulating layer;
a data conductor on the second interlayer insulating layer, the data conductor including a data line;

an insulating layer on the data conductor;
a first electrode on a top surface of the insulating layer; and
an organic light emitting layer on the first electrode;
a second electrode on the organic light emitting layer, wherein:
one of the first interlayer insulating layer and the second interlayer insulating layer is an organic layer and another thereof is an inorganic layer,
the data conductor contacts the second interlayer insulating layer, and
the first interlayer insulating layer and the second interlayer insulating layer overlap the capacitor electrode and the first gate electrode in a direction perpendicular to the substrate.

2. The organic light emitting diode display as claimed in claim 1, wherein:
the data conductor includes a gate bridge which contacts the first gate electrode through the first interlayer insulating layer and the second interlayer insulating layer.

3. The organic light emitting diode display as claimed in claim 2, wherein:
the first interlayer insulating layer includes a first contact hole through which the gate bridge passes, and
the second interlayer insulating layer includes a second contact hole through which the gate bridge passes.

4. The organic light emitting diode display as claimed in claim 3, wherein:
the first contact hole of the first interlayer insulating layer is formed by etching, and
the second contact hole of the second interlayer insulating layer is formed by exposure and development.

5. The organic light emitting diode display as claimed in claim 3, wherein:
the first interlayer insulating layer is the organic layer, and
the second interlayer insulating layer is the inorganic layer.

6. The organic light emitting diode display as claimed in claim 5, wherein:
the second contact hole of the second interlayer insulating layer is formed by etching, and
the first contact hole of the first interlayer insulating layer is formed by etching using the second interlayer insulating layer as a mask.

7. The organic light emitting diode display as claimed in claim 1, wherein
the first interlayer insulating layer is the inorganic layer, and
the second interlayer insulating layer is the organic layer.

8. The organic light emitting diode display as claimed in claim 1, wherein the second interlayer insulating layer has a lower dielectric constant than the first interlayer insulating layer.

9. The organic light emitting diode display as claimed in claim 1, further comprising a second thin film transistor including a second active pattern and a second gate electrode on the second active pattern, wherein the data conductor includes a gate bridge, the gate bridge connecting between the first gate electrode of the first thin film transistor and the second active pattern of the second thin film transistor through the first interlayer insulating layer and the second interlayer insulating layer.

10. An organic light emitting diode display, comprising:
a substrate;
a first thin film transistor including a first active pattern on the substrate and a first gate electrode on the first active pattern;
a data wire on the first gate electrode;
a first interlayer insulating layer between the first gate electrode and the data wire;
a second interlayer insulating layer between the first interlayer insulating layer and the data wire, wherein the data wire includes a gate bridge which contacts the first gate electrode through the first interlayer insulating layer and the second interlayer insulating layer;
an organic light emitting diode on the data wire and connected to the first active pattern;
a second thin film transistor including a second active pattern connected to the first active pattern and a second gate electrode on the second active pattern;
a third thin film transistor including a third active pattern which contacts the gate bridge to connect between the first active pattern and the first gate electrode, and a third gate electrode on the third active pattern; and
a first scan line on the second active pattern and crossing the second active pattern and the third active pattern, respectively, the first scan line being connected to the second gate electrode and the third gate electrode,
wherein the data wire includes:
a data line adjacent to the gate bridge on the first scan line to cross the first scan line and connected to the second active pattern; and
a driving power line adjacent the data line, crossing the first scan line, and connected to the first active pattern.

11. The organic light emitting diode display as claimed in claim 10, further comprising:
a capacitor electrode between the first gate electrode and the first interlayer insulating layer to be connected to the driving power line through the first interlayer insulating layer and the second interlayer insulating layer, the capacitor electrode overlapping the first gate electrode to form a capacitor along with the first gate electrode.

12. The organic light emitting diode display as claimed in claim 11, wherein:
the first gate electrode and the capacitor electrode are each made of metal.

13. The organic light emitting diode display as claimed in claim 11, wherein:
the capacitor electrode includes an opening through which a portion of the first gate electrode is exposed and the gate bridge is connected to the first gate electrode through the opening.

14. The organic light emitting diode display as claimed in claim 10, wherein:
the first active pattern, the second active pattern, and the third active pattern are each positioned on a same layer, and
the data line, the driving power line, and the gate bridge are each positioned on the same layer.

15. The organic light emitting diode display as claimed in claim 10, further comprising:
a fourth thin film transistor including a fourth active pattern connected to the first gate electrode and the third active pattern, and a fourth gate electrode on the fourth active pattern;
a second scan line on the fourth active pattern, crossing the fourth active pattern, and connected to the fourth gate electrode; and
an initialization power line on the second scan line and connected to the fourth active pattern.

16. The organic light emitting diode display as claimed in claim 15, wherein:
the first gate electrode, the second gate electrode, the third gate electrode, the fourth gate electrode, the first scan line, and the second scan line are each on a same layer.

17. The organic light emitting diode display as claimed in claim 15, further comprising:
a seventh thin film transistor including a seventh active pattern connected to the fourth active pattern and a seventh gate electrode on the seventh active pattern; and
a third scan line on the seventh active pattern, crossing the seventh active pattern, and connected to the seventh gate electrode.

18. The organic light emitting diode display as claimed in claim 10, further comprising:
a fifth thin film transistor including a fifth active pattern which connects between the first active pattern and the driving power line, and a fifth gate electrode on the fifth active pattern;
a sixth thin film transistor including a sixth active pattern which connects between the first active pattern and the organic light emitting diode, and a sixth gate electrode on the sixth active pattern; and
a light emitting control line crossing the fifth active pattern and the sixth active pattern, respectively and connected to the fifth gate electrode and the sixth gate electrode, respectively.

19. The organic light emitting diode display as claimed in claim 18, wherein:
the first gate electrode, the second gate electrode, the third gate electrode, the fifth gate electrode, the sixth gate electrode, the light emitting control line are each on a same layer.

* * * * *